United States Patent
Golden et al.

(10) Patent No.: US 10,065,853 B2
(45) Date of Patent: Sep. 4, 2018

(54) OPTIMIZED EPOXY DIE ATTACH GEOMETRY FOR MEMS DIE

(71) Applicant: Rosemount Aerospace Inc., Burnsville, MN (US)

(72) Inventors: Jim Golden, Afton, MN (US); Robert Stuelke, Minneapolis, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 58 days.

(21) Appl. No.: 15/161,724

(22) Filed: May 23, 2016

(65) Prior Publication Data

US 2017/0334713 A1    Nov. 23, 2017

(51) Int. Cl.
   *B81B 7/00*    (2006.01)
   *G01L 19/14*   (2006.01)
   *G01L 9/00*    (2006.01)
   *B81C 1/00*    (2006.01)

(52) U.S. Cl.
   CPC ........ *B81B 7/0061* (2013.01); *B81C 1/00309* (2013.01); *G01L 9/0042* (2013.01); *G01L 19/147* (2013.01); *B81B 2201/0264* (2013.01); *B81B 2203/0127* (2013.01); *B81C 2203/019* (2013.01)

(58) Field of Classification Search
   CPC .... B81B 2201/0264; B81B 2203/0127; B81B 7/0061; B81C 2203/019; G01L 19/147; G01L 9/0042
   See application file for complete search history.

(56) References Cited

U.S. PATENT DOCUMENTS 3,697,919 A * 10/1972 Orth .................. G01L 19/003
                                                338/42
3,909,045 A *  9/1975 Meagher .............. F16L 13/11
                                                285/22

(Continued)

OTHER PUBLICATIONS

Sarvar, Farhad, David A. Hutt, and David C. Whalley. "Application of adhesives in MEMS and MOEMS assembly: a review." Polymers and Adhesives in Microelectronics and Photonics, 2002. Polytronic 2002. 2nd International IEEE Conference on. IEEE, 2002.*

(Continued)

*Primary Examiner* — Harshad R Patel
*Assistant Examiner* — Punam Roy
(74) *Attorney, Agent, or Firm* — Kinney & Lange, P.A.

(57) ABSTRACT

A differential pressure sensor is a body with first and second interior channels connected to process fluid inlets and separated by a barrier. Each side of a MEMS pressure sensing diaphragm in the barrier is fluidly connected to a process fluid inlet. The diaphragm is mounted on a hollow pedestal such that one side of the diaphragm is fluidly connected to a process fluid inlet through an interior channel in the pedestal that is adhesively attached to an annular bottom of a cylindrical cavity inside the body. The other side of the diaphragm is fluidly connected to the other process fluid inlet and is fluidly isolated from the first fluid inlet by the adhesive at the bottom of the pedestal. Deformation of the diaphragm due to a pressure difference between the process fluid inlets detected by sensors on the diaphragm indicates a differential pressure.

16 Claims, 5 Drawing Sheets

(56) References Cited

U.S. PATENT DOCUMENTS

| | | | | |
|---|---|---|---|---|
| 3,937,641 | A * | 2/1976 | Kushner | F16L 13/103 138/DIG. 1 |
| 4,095,825 | A * | 6/1978 | Butler | B29C 57/00 156/294 |
| 4,296,993 | A * | 10/1981 | Wellington | H05K 3/308 439/876 |
| 4,536,820 | A * | 8/1985 | Binder | G01L 9/0073 361/283.1 |
| 4,670,730 | A * | 6/1987 | Takeda | G01L 9/0051 29/621.1 |
| 5,459,351 | A * | 10/1995 | Bender | G01L 19/143 257/417 |
| 5,515,732 | A * | 5/1996 | Willcox | G01L 9/0042 73/718 |
| 5,670,722 | A * | 9/1997 | Moser | G01L 19/0084 73/718 |
| 5,792,958 | A * | 8/1998 | Speldrich | G01L 19/06 338/42 |
| 5,851,036 | A * | 12/1998 | Vanesky | B29C 66/5221 156/305 |
| 5,862,861 | A * | 1/1999 | Kalsi | E21B 33/12 166/192 |
| 5,985,086 | A * | 11/1999 | Peall | B29C 65/548 156/292 |
| 6,117,086 | A * | 9/2000 | Shulze | A61B 5/0215 600/486 |
| 6,566,158 | B2 * | 5/2003 | Eriksen | H01L 21/76254 257/E21.541 |
| 6,647,794 | B1 * | 11/2003 | Nelson | G01L 9/0073 73/718 |
| 6,690,255 | B2 * | 2/2004 | Caramela | H01F 27/2823 336/192 |
| 6,935,179 | B2 * | 8/2005 | Banholzer | G01L 9/0075 73/700 |
| 7,137,304 | B2 * | 11/2006 | Martin | G01L 13/025 73/756 |
| 7,458,275 | B2 * | 12/2008 | Kleven | G01L 19/003 73/745 |
| 7,538,401 | B2 * | 5/2009 | Eriksen | C23C 14/021 257/419 |
| 7,754,046 | B2 * | 7/2010 | Bottacin | B29C 66/1122 156/293 |
| 8,371,175 | B2 * | 2/2013 | Romo | G01L 19/146 73/753 |
| 8,439,404 | B2 * | 5/2013 | Anton | F16J 15/064 285/382.7 |
| 9,588,309 | B2 * | 3/2017 | Craddock | G02B 6/4251 |
| 9,689,766 | B2 * | 6/2017 | Lemke | G01L 9/0042 |
| 2004/0201174 | A1 * | 10/2004 | Dodgson | B29C 65/548 277/316 |
| 2005/0151369 | A1 * | 7/2005 | Baruh | F16L 25/12 285/31 |
| 2011/0252882 | A1 * | 10/2011 | Beck | G01F 1/6845 73/204.27 |
| 2014/0117663 | A1 * | 5/2014 | Tanguay | F16L 13/0209 285/288.11 |
| 2015/0247773 | A1 | 9/2015 | Wagner et al. | |
| 2016/0340176 | A1 * | 11/2016 | Potasek | B81B 7/0058 |
| 2017/0205303 | A1 * | 7/2017 | Sanden | G01L 13/06 |
| 2017/0234752 | A1 * | 8/2017 | Potasek | G01L 19/0645 |
| 2017/0350783 | A1 * | 12/2017 | Sixtensson | G01L 19/146 |

OTHER PUBLICATIONS

Gorce, Jean-Baptiste, Ian J. Hewitt, and Dominic Vella. "Capillary imbibition into converging tubes: Beating washburn's law and the optimal imbibition of liquids." Langmuir 32.6 (2016): 1560-1567.*

Extended European Search Report, for European Patent Application No. 17172484.2, dated Sep. 25, 2017, 8 pages.

* cited by examiner

OPTIMIZED EPOXY DIE ATTACH GEOMETRY FOR MEMS DIE

BACKGROUND

This disclosure relates to pressure sensors, and particularly to MEMS compact differential pressure sensors.

Pressure transmitters are commonly used in industrial processes to measure and monitor pressures of various industrial process fluids such as vapors and gases of engines and other power sources. Differential pressure transmitters generally include a pair of process fluid inputs which are coupled to a differential pressure sensor in the transmitter that responds to a difference in pressure between the two inputs. Differential pressure transmitters typically include a differential pressure sensor coupled to a pair of isolator diaphragms. The isolator diaphragms are positioned at the process fluid inlets and isolate the differential pressure sensor from process fluids being sensed. Pressure is transferred from the process fluid to the differential pressure sensor through a thermally stable fill fluid in a passageway extending from the isolator diaphragms to the differential pressure sensor.

There is a need for a compact differential pressure sensor with a MEMS sensing element that is firmly attached to the sensor body.

SUMMARY

A differential pressure sensor may include a body with a first end, second end and wall wherein the first and second ends comprise isolator diaphragms connected to first and second process fluid inlets. A MEMS pressure sensor including a pressure sensing diaphragm with first and second sides may be mounted on a hollow pedestal adhesively attached to an annular bottom of a cylindrical cavity wherein the first side of the sensor is coupled to the first isolator diaphragm by a first fill fluid and the second side of the sensor is coupled to the second isolator diaphragm through the interior of the hollow pedestal by a second fill fluid volume wherein the first and second fill fluid volumes are separated by an adhesive seal between the bottom of the cylindrical cavity and the bottom of the hollow pedestal wherein the cylindrical cavity comprises a first cylindrical wall with a first diameter in contact with the annular bottom, a frustroconical portion in contact with the first cylindrical wall and in contact with a second cylindrical wall with a second diameter larger than the first diameter such that the increased distance between the pedestal and the cylindrical wall prevents adhesive moving up the space between the pedestal and cavity wall from the bottom of the cavity when the pressure sensor and hollow pedestal are mounted in the cavity. The sensor further includes sensor elements on the MEMS diaphragm that provide an indication of pressure differences between the first and second process fluids.

In an embodiment, a differential pressure sensor that includes a body and a MEMS sensor mounted on a hollow pedestal that is attached to a bottom of a cylindrical cavity of the body by adhesive material, a method of limiting wicking of the adhesive material up a wall of the cylindrical cavity between the hollow pedestal and the wall of the cylindrical cavity includes forming a first cylindrical portion of the wall of the cylindrical cavity with a first diameter in contact with the bottom of the cylindrical cavity. The method further includes forming a second cylindrical wall portion of the wall of the cylindrical cavity with a second diameter larger than the first diameter and forming a frustroconical portion of the wall of the cylindrical cavity in contact with and between the first cylindrical portion and the second cylindrical portion, a frustroconical portion of the wall of the cylindrical cavity being configured to limit wicking of the adhesive material up the wall of the cylindrical cavity.

DETAILED DESCRIPTION

Figure 1:
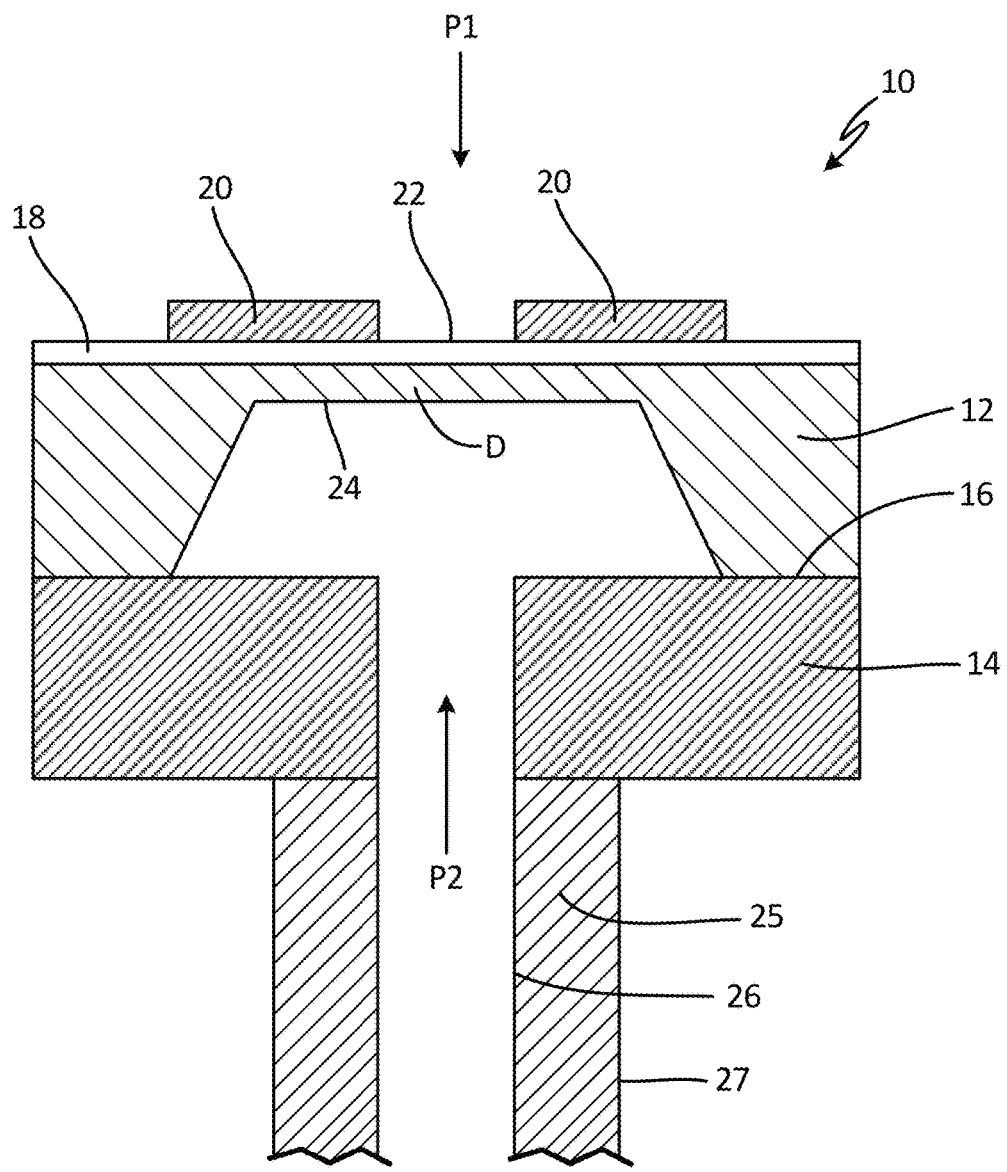
FIG. 1 is a schematic cross-section of a MEMS pressure sensor.

FIG. 1 is a schematic cross-section of microelectromechanical system (MEMS) pressure sensor 10. Pressure sensor 10 may include a single crystal silicon wafer 12 secured to silicon backing wafer 14 along bond line 16. The thin wall of wafer 12 is configured to form diaphragm D having bottom surface 24. Dielectric coating 18 and sensing elements 20 with associated circuitry (not shown) are located on top surface 22 of diaphragm D. Sensing elements 20 are operable to detect deflection of diaphragm D due to a change in differential pressures P1 and P2. Sensing elements 20 may be piezoelectric, piezoresistive or other sensing means known in the art. MEMS pressure sensor 10 may be used, with the general configuration shown in FIG. 1, in embodiments of the differential pressure sensor shown in FIGS. 2, 3, 4 and 5 and described below. MEMS pressure sensor 10 may be mounted on hollow pedestal 25 comprising inner wall 26 and outer wall 27.

Figure 2:
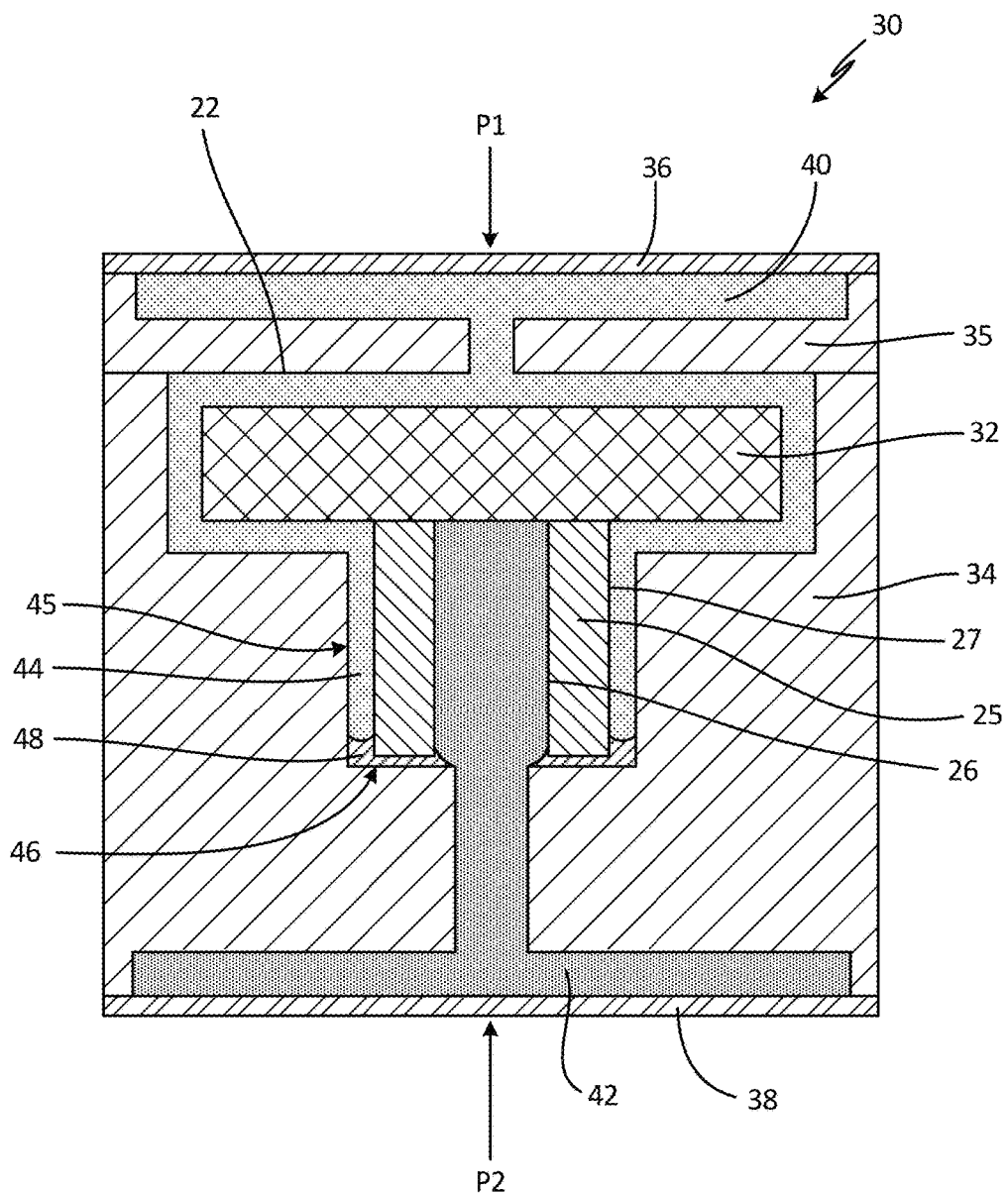
FIG. 2 is a schematic cross-section of a prior art differential pressure sensor with symmetric MEMS die attach geometry.

FIG. 2 is a schematic cross-section of a prior art differential pressure sensing capsule. Capsule 30 may comprise MEMS pressure sensor 32 with top surface 22 as described in FIG. 1. Diaphragm D, bottom surface 24, and sensing elements 20 and associated circuitry of MEMS pressure sensor 32 (which are similar to the configuration shown in FIG. 1 for MEMS pressure sensor 10) are not shown for clarity reasons. MEMS pressure sensor 32 is mounted on hollow pedestal 25 in capsule 30. Hollow pedestal 25 comprises inner wall 26 and outer wall 27. Capsule 30 may have metal header 34 and isolator diaphragms 36 and 38 separating cavities 40 and 42 from the external surroundings of capsule 30. Fill fluids in cavities 40 and 42 provide fluid contact between isolator diaphragms 36 and 38 and top surface 22 and bottom surface 24 (not shown, but as described above in FIG. 1) of MEMS pressure sensor 32. Isolator diaphragms 36 and 38 may be exposed to process fluids with the purpose of transmitting process fluid pressures P1 and P2 from remote sources to the sensing surfaces 22 and 24 of MEMS pressure sensor 32. Internal and external circuitry and mechanical and fluid connections to process fluid environments have been omitted for clarity.

Hollow pedestal 25 may be made of Pyrex, Kovar, or other low thermal expansion materials known in the art that are within about 100% or less than the coefficient of thermal expansion of silicon. Header 34 and isolation diaphragms 36 and 38 may be made of stainless steel. In particular, the metal components may be 316L stainless steel in an exemplary embodiment. Fill fluids in cavities 40 and 42 are indicated in FIG. 2 by dark shading.

During assembly of differential pressure sensor 30, top portion 35 of header 34 is absent and sensor 32 with hollow pedestal 25 attached is placed in cylindrical cavity 44. The diameter of cylindrical cavity 44 is about 18-22% larger than the diameter of hollow pedestal 25. Sensor 32 with hollow pedestal 25 attached is secured to annular bottom 46 of cylindrical cavity 44 by sealant 48. In an embodiment, sealant 48 may be epoxy, silicone, polyimide, solder, braze, or other die attachment materials known in the art. Sealant 48 prevents fill fluids in chambers 40 and 42 from contacting each other. The integrity of the seal provided by sealant 48 in cavity 44 contributes to the accuracy of differential pressure measurements from sensor 30. It is therefore important that sufficient sealant is applied so that some sealant moves up the walls 45 of cylindrical cavity 44 above the bottom of hollow pedestal 25 as shown in FIG. 2.

Figure 3:
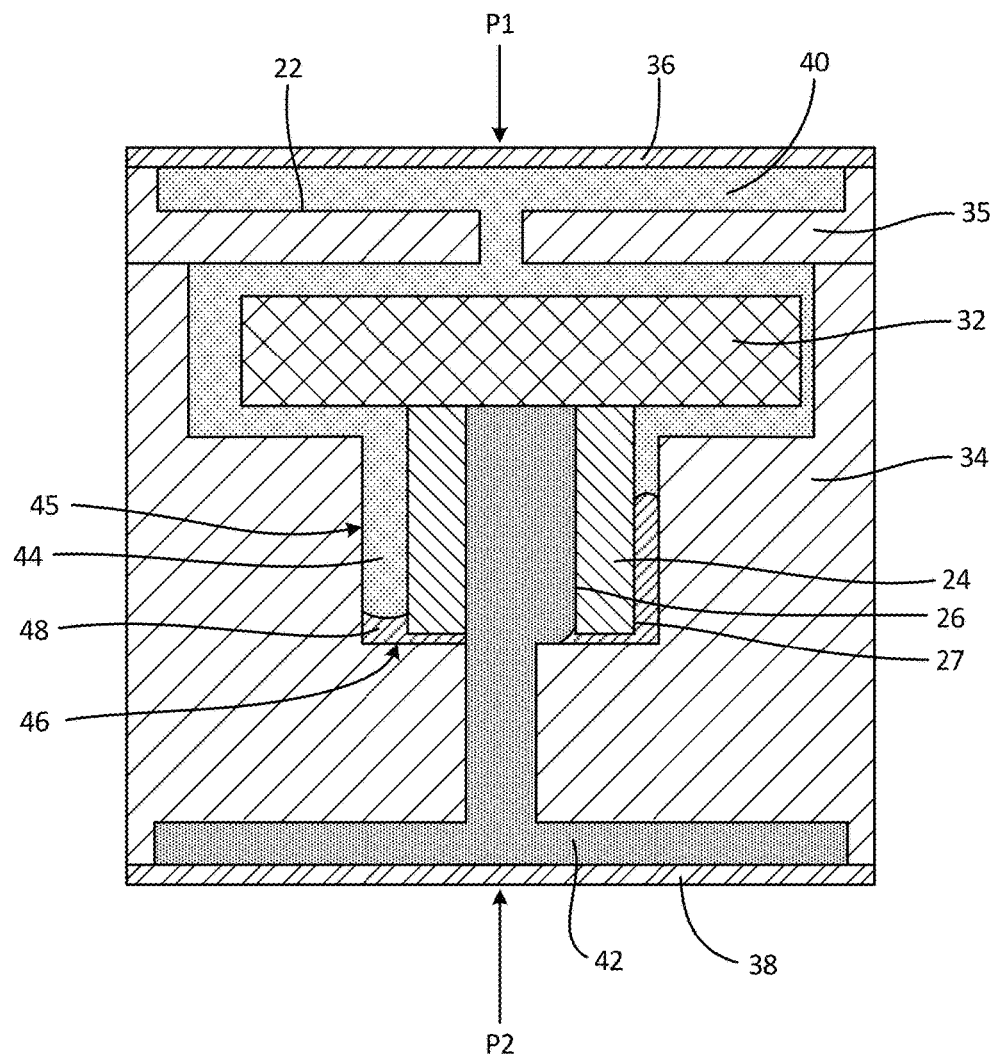
FIG. 3 is a schematic cross-section of a prior art differential pressure sensor with asymmetric MEMS die attach geometry.

If sensor 32 with attached hollow pedestal 25 is not centered during placement in cylindrical cavity 44, the situation illustrated in FIG. 3 may occur. When hollow pedestal 25 is too close to the walls of cylindrical cavity 44, sealant 48 may be forced up between hollow pedestal 25 and the walls 45 of cylindrical cavity 44, and may lead to a thinner layer of adhesive 48 that may be insufficient to produce a seal between chambers 40 and 42. The thin layer of adhesive may crack during temperature cycling and provide a leakage path between chambers 40 and 42 resulting in scrapped sensor assembly. Nominal clearances between the outer walls of hollow pedestal 25 and the walls 45 of cylindrical cavity 44 may be about 10 mils (254 microns) in some embodiments to assure proper sealing of pedestal 24 to annular bottom 46 of cylindrical cavity 44. The thin layer of sealant 48 that is forced up the wall of cylindrical cavity 44 during placement of sensor 32 and pedestal 25 may not form a barrier between fill fluids in cavities 40 and 42.

Figure 4:
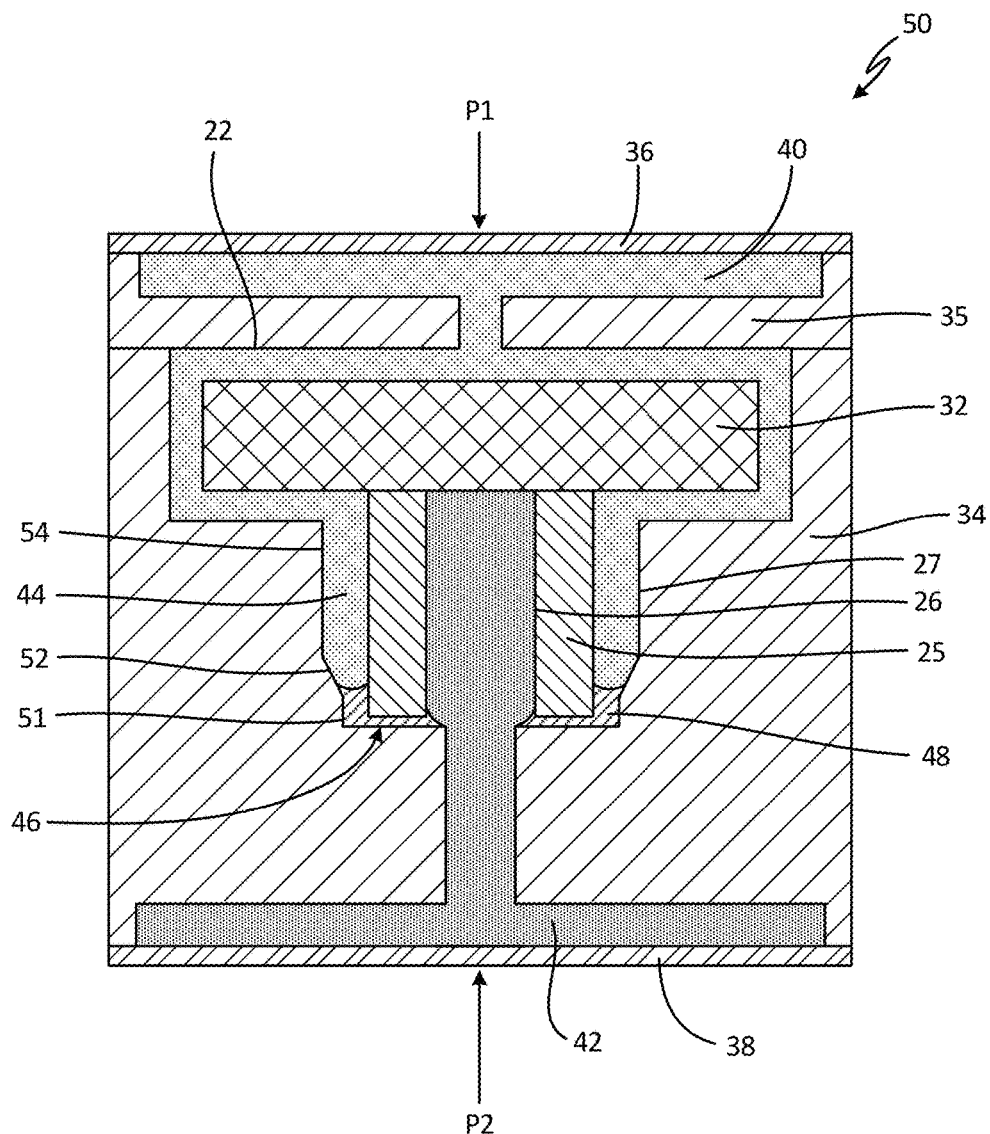
FIG. 4 is a schematic cross-section of a differential pressure sensor according to an embodiment of the present invention.

A solution to this problem is illustrated in FIG. 4, which is a schematic cross-section of differential pressure sensor 50 according to an embodiment of the present invention. As shown in FIG. 4, cylindrical cavity 44 has three sections—lower cylindrical wall 51, middle frustoconical wall 52, and upper cylindrical wall 54. Lower cylindrical wall 51 of the bottom portion of cavity 44 has a diameter identical to the corresponding portion illustrated in FIG. 2, to assure proper contact of sealant 48 to header 34 and hollow pedestal 25. The diameter of upper cylindrical wall 54 of the upper section of cavity 44 is configured to be about 20% to 30% larger than lower cylindrical wall 51. Upper cylindrical wall 54 and lower cylindrical wall 51 are connected by frustoconical wall 52. This geometry prevents sealant 48 from forming a weak bond between hollow pedestal 25 and the walls of cylindrical cavity 44 because of the increased volume in cavity 44 above lower cylindrical wall 51 of cylindrical cavity 44.

Figure 5:
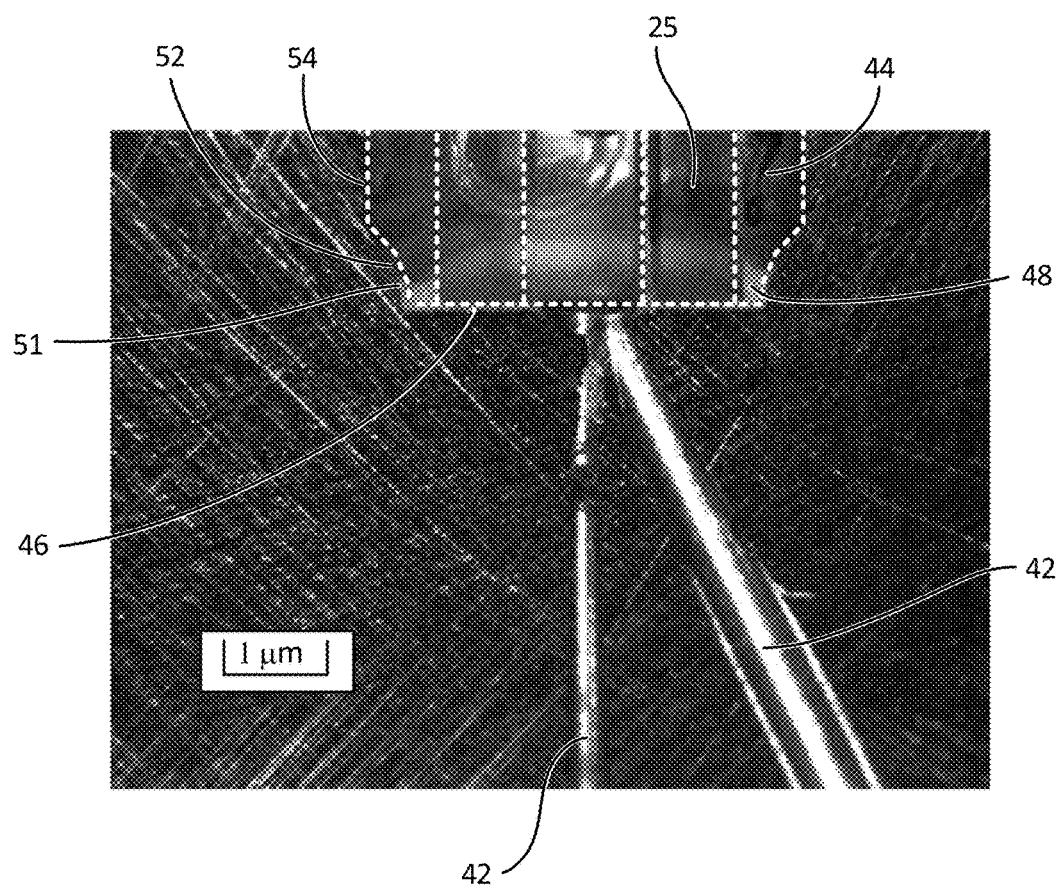
FIG. 5 is a photograph of a cross-section of a differential pressure sensor according to an embodiment of the present invention.

FIG. 5 is a photograph of a cross-section of a differential pressure sensor according to an embodiment of the present invention. FIG. 5 shows an example of the actual construction of components of differential pressure sensor 50 that were illustrated schematically in FIG. 4. The outlines of cavity 44 and hollow pedestal 25 are indicated by a white dashed line and components indicated in FIG. 4 are marked accordingly.

Discussion of Possible Embodiments

The following are non-exclusive descriptions of possible embodiments of the present invention.

A differential pressure sensor includes: a body with a first end, a second end and a header wall therebetween, wherein the first end and the second end comprises first and second isolator diaphragms connected to first and second process fluid inlets, respectively; a MEMS pressure sensor including a pressure sensing diaphragm with first and second sides mounted on a hollow pedestal that is adhesively attached to an annular bottom of a cylindrical cavity in the header wall, wherein the first side of the pressure sensing diaphragm is coupled to the first isolator diaphragm by a first fill fluid volume, and the second side of the sensor is coupled to the second isolator diaphragm through an interior of the hollow pedestal by a second fill fluid volume, the first and second fill fluid volumes being separated by an adhesive seal between the bottom of the cylindrical cavity and the bottom of a hollow pedestal, wherein the cylindrical cavity is defined by a first cylindrical wall portion with a first diameter in contact with the annular bottom, a second cylindrical wall portion with a second diameter larger than the first diameter, and a frustoconical portion in contact with the first cylindrical wall portion and the second cylindrical wall portion; and at least one sensor element on the pressure sensing diaphragm configured to provide an indication of pressure differences between the first and second process fluids.

The sensor of the preceding paragraph can optionally include, additionally and/or alternatively any, one or more of the following features, configurations and/or additional components:

A distance from an outside wall of the hollow pedestal to the first cylindrical wall portion may be from about 5 mils (127 microns) to 15 mils (381 microns).

A distance from an outer wall of the hollow pedestal to the second cylindrical wall portion may be from about 20 mils (508 microns) to 30 mils (762 microns).

The pressure sensing diaphragm may be made from a single crystal silicon wafer.

The hollow pedestal may be Pyrex, Kovar, or another low thermal expansion material that has a coefficient of thermal expansion within about 100% or less than the thermal expansion of silicon.

The body may be made of metal.

The metal may be stainless steel.

The adhesive seal may be one or more of epoxy, silicone, polyimide, solder, and braze.

The first diameter may be 10% to 20% larger than a diameter of the hollow pedestal.

The second diameter may be 20% to 30% larger than the diameter of the hollow pedestal at a distance of 0.5 to 0.75 times a thickness of the walls of the hollow pedestal from the top of the first diameter, thereby limiting sealant wicking up between the walls of the cylindrical cavity and the hollow pedestal.

In a differential pressure sensor that includes a body and a MEMS sensor mounted on a hollow pedestal that is attached to a bottom of a cylindrical cavity of the body by adhesive material, a method of limiting wicking of adhesive material up the wall of the cylindrical cavity between the hollow pedestal and the wall of the cylindrical cavity includes: forming a first cylindrical portion of the wall of the cylindrical cavity with a first diameter in contact with the bottom of the cylindrical cavity; forming a second cylindrical wall portion of the wall of the cylindrical cavity with a second diameter larger than the first diameter; and forming a frustroconical portion of the wall of the cylindrical cavity in contact with and between the first cylindrical portion and the second cylindrical portion, the frustroconical portion of the wall of the cylindrical cavity being configured to limit wicking of the adhesive material up the wall of the cylindrical cavity.

The method of the preceding paragraph can optionally include, additionally and/or alternatively any, one or more of the following features, configurations and/or additional components:

A distance from an outer wall of the hollow pedestal to the first cylindrical wall portion may be from about 5 mils (127 microns) to 15 mils (381 microns).

A distance from an outer wall of the hollow pedestal to the second wall portion may be from about 20 mils (508 microns) to 30 mils (762 microns).

A sensing element of the MEMS pressure sensor may be made from a single crystal silicon wafer.

The hollow pedestal may be Pyrex, Kovar, or another low thermal expansion material that has a coefficient of thermal expansion within about 100% or less than the thermal expansion of silicon.

The adhesive seal may be one or more of epoxy, silicone, polyimide, solder, and braze.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A differential pressure sensor comprising:
   a body with a first end, a second end and a header wall therebetween, wherein the first end and the second end comprise first and second isolator diaphragms connected to first and second process fluid inlets, respectively;
   a MEMS pressure sensor including a pressure sensing diaphragm with first and second sides mounted on a hollow cylindrical pedestal that is adhesively attached to an annular bottom of a cylindrical cavity in the header wall, wherein the first side of the pressure sensing diaphragm is coupled to the first isolator diaphragm by a first fill fluid volume, and the second side of the pressure sensing diaphragm is coupled to the second isolator diaphragm through an interior of the hollow pedestal by a second fill fluid volume, the first and second fill fluid volumes being separated by an adhesive seal between the bottom of the cylindrical cavity and a bottom of the hollow pedestal, wherein the cylindrical cavity is defined by a first cylindrical wall portion with a first diameter in contact with the annular bottom, a second cylindrical wall portion with a second diameter larger than the first diameter, and a frustoconical portion in contact with the first cylindrical wall portion and the second cylindrical wall portion, and situated between the first and second cylindrical wall portions, and wherein the first diameter is greater than an outer diameter of the hollow cylindrical pedestal, such that a first radial gap separates the hollow cylindrical pedestal from the first cylindrical wall portion, and a second radial gap wider than the first radial gap separates the hollow cylindrical portion from the second cylindrical wall portion; and
   at least one sensor element on the pressure sensing diaphragm configured to provide an indication of pressure differences between the first and second process fluids.

2. The sensor of claim 1, wherein a distance from an outside wall of the hollow pedestal to the first cylindrical wall portion is from about 5 mils (127 microns) to 15 mils (381 microns).

3. The sensor of claim 1, wherein a distance from an outer wall of the hollow pedestal to the second cylindrical wall portion is from about 20 mils (508 microns) to 30 mils (762 microns).

4. The sensor of claim 1, wherein the pressure sensing diaphragm is made from a single crystal silicon wafer.

5. The sensor of claim 1, wherein the hollow pedestal is made of Pyrex, Kovar, or another low thermal expansion material that has a coefficient of thermal expansion within about 100% or less than the thermal expansion of silicon.

6. The sensor of claim 1, wherein the body is made of metal.

7. The sensor of claim 6, wherein the metal is stainless steel.

8. The sensor of claim 1, wherein the adhesive seal comprises one or more of epoxy, silicone, polyimide, solder, and braze.

9. The sensor of claim 1, wherein the first diameter is 10% to 20% larger than a diameter of the hollow pedestal.

10. The sensor of claim 1, wherein the second diameter is 20% to 30% larger than the diameter of the hollow pedestal at a distance of 0.5 to 0.75 times a thickness of the walls of the hollow pedestal from the top of the first diameter, thereby limiting sealant wicking up between the walls of the cylindrical cavity and the hollow pedestal.

11. In a differential pressure sensor that includes a body and a MEMS sensor mounted on a hollow pedestal that is attached to a bottom of a cylindrical cavity of the body by adhesive material, a method of limiting wicking of the adhesive material up the wall of the cylindrical cavity between the hollow pedestal and the wall of the cylindrical cavity, the method comprising:
   forming a first cylindrical portion of the wall of the cylindrical cavity in contact with the bottom of the cylindrical cavity, the first cylindrical portion having a first diameter;
   forming a second cylindrical wall portion of the wall of the cylindrical cavity with a second diameter larger than the first diameter; and
   forming a frustroconical portion of the wall of the cylindrical cavity in contact with and situated between the first cylindrical portion and the second cylindrical portion, the frustroconical portion of the wall of the cylindrical cavity being configured to limit wicking of the adhesive material up the wall of the cylindrical cavity;
   wherein the first diameter is greater than an outer diameter of the hollow pedestal, such that the hollow pedestal is separated from the first cylindrical wall by a first radial gap, and from the second cylindrical wall by a second radial gap wider than the first radial gap.

12. The method of claim 11, wherein a distance from an outer wall of the hollow pedestal to the first cylindrical wall portion is from about 5 mils (127 microns) to 15 mils (381 microns).

13. The method of claim 12, wherein the adhesive seal comprises one or more of epoxy, silicone, polyimide, solder, and braze.

14. The method of claim 11, wherein a distance from an outer wall of the hollow pedestal to the second wall portion is from about 20 mils (508 microns) to 30 mils (762 microns).

15. The method of claim 11, wherein a sensing element of the MEMS pressure sensor is made from a single crystal silicon wafer.

16. The method of claim 11, wherein the hollow pedestal is made of Pyrex, Kovar, or another low thermal expansion material that has a coefficient of thermal expansion within about 100% or less than the thermal expansion of silicon.

* * * * *